United States Patent
Coban et al.

(10) Patent No.: US 10,523,251 B1
(45) Date of Patent: Dec. 31, 2019

(54) AUTOMATIC GAIN CONTROL SYSTEM AND METHOD WITH IMPROVED BLOCKER PERFORMANCE

(71) Applicant: SILICON LABORATORIES INC., Austin, TX (US)

(72) Inventors: Abdulkerim L. Coban, Austin, TX (US); Emmanuel Gautier, Betton (FR); Fabrice Portier, Thorigné-Fouillard (FR); Pascal Blouin, Domloup (FR); Wenhuan Yu, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 16/156,294

(22) Filed: Oct. 10, 2018

(51) Int. Cl.
| | |
|---|---|
| *H04B 1/10* | (2006.01) |
| *H04L 25/08* | (2006.01) |
| *H04B 17/336* | (2015.01) |
| *H03F 3/19* | (2006.01) |
| *H03G 3/30* | (2006.01) |
| *H04L 25/03* | (2006.01) |

(52) U.S. Cl.
CPC ............. *H04B 1/1027* (2013.01); *H03F 3/19* (2013.01); *H03G 3/3036* (2013.01); *H04B 17/336* (2015.01); *H04L 25/08* (2013.01); *H03F 2200/294* (2013.01); *H03F 2200/451* (2013.01); *H03G 2201/103* (2013.01); *H03G 2201/302* (2013.01); *H04L 2025/03356* (2013.01)

(58) Field of Classification Search
CPC ........... H03G 3/3036; H03G 2201/103; H03G 2201/302; H04B 1/1027; H04B 17/336; H04L 25/08; H04L 2025/03356; H03F 2200/451; H03F 3/19; H03F 2200/294
See application file for complete search history.

(56) References Cited

U.S. PATENT DOCUMENTS

| | | | | |
|---|---|---|---|---|
| 5,513,387 | A * | 4/1996 | Saito | H03G 3/3052 455/241.1 |
| 5,617,060 | A * | 4/1997 | Wilson | H03D 3/002 330/129 |
| 6,959,082 | B1 * | 10/2005 | Holeva | H03G 3/3089 379/388.03 |
| 9,264,280 | B1 * | 2/2016 | Waheed | H04L 27/3809 |
| 9,831,902 | B2 * | 11/2017 | Moon | H04B 1/16 |
| 9,847,765 | B1 * | 12/2017 | Helm | H03F 3/193 |
| 10,230,345 | B1 * | 3/2019 | Arslan | H03G 3/3036 |

(Continued)

*Primary Examiner* — Jean B Corrielus
(74) *Attorney, Agent, or Firm* — Gary Stanford; James W. Huffman

(57) ABSTRACT

A communications receiver with improved blocker performance including multiple gain tables selected based on a number of reductions or back offs from a maximum coarse gain setting. A receiver chain with multiple gain stages converts a received signal to a digital format, determines the power level of the received signal, and provides an overload indication. A first gain table maximizes SNR and SNDR for weak blockers and at least one additional gain table successively improves SNDR for stronger blockers. An AGC circuit initially sets the coarse gain setting to maximum, and backs off a number of coarse gain steps until the receiver chain is not overloaded. The number of back off steps is used to select a gain table, the power level is used to select an entry in the selected table, and the selected entry includes gain settings for the gain stages of the receiver chain.

20 Claims, 7 Drawing Sheets

(56) References Cited

U.S. PATENT DOCUMENTS

| | | | | |
|---|---|---|---|---|
| 2005/0026583 A1* | 2/2005 | Carpineto | .............. | H04B 1/109 |
| | | | | 455/232.1 |
| 2010/0172450 A1* | 7/2010 | Komaili | .............. | H04L 27/3809 |
| | | | | 375/345 |
| 2011/0076977 A1* | 3/2011 | Coban | ...................... | H04B 1/16 |
| | | | | 455/234.2 |
| 2013/0195215 A1* | 8/2013 | Manglani | .............. | H04B 17/318 |
| | | | | 375/295 |
| 2017/0310350 A1* | 10/2017 | Tanaka | ..................... | H04B 1/16 |

* cited by examiner

| GT1 | | | | |
|---|---|---|---|---|
| PIN (dBm) | G1 (dB) | G2 (dB) | G3 (dB) | GT (dB) |
| < -80 | 20 | 20 | 20 | 60 |
| -80 | 20 | 20 | 20 | 60 |
| -78 | 20 | 20 | 20 | 60 |
| -76 | 20 | 20 | 20 | 60 |
| -74 | 20 | 20 | 20 | 60 |
| -72 | 20 | 20 | 20 | 60 |
| -70 | 20 | 20 | 18 | 58 |
| -68 | 20 | 20 | 16 | 56 |
| -66 | 20 | 20 | 14 | 54 |
| -64 | 20 | 20 | 12 | 52 |
| -62 | 20 | 20 | 10 | 50 |
| -60 | 20 | 20 | 8 | 48 |
| -58 | 20 | 20 | 6 | 46 |
| -56 | 20 | 20 | 4 | 44 |
| -54 | 20 | 20 | 2 | 42 |
| -52 | 20 | 20 | 0 | 40 |
| -50 | 20 | 18 | 0 | 38 |
| -48 | 20 | 16 | 0 | 36 |
| -46 | 20 | 14 | 0 | 34 |
| -44 | 20 | 12 | 0 | 32 |
| -42 | 20 | 10 | 0 | 30 |
| -40 | 20 | 8 | 0 | 28 |
| -38 | 20 | 6 | 0 | 26 |
| -36 | 20 | 4 | 0 | 24 |
| -34 | 20 | 2 | 0 | 22 |
| -32 | 20 | 0 | 0 | 20 |
| -30 | 18 | 0 | 0 | 18 |
| -28 | 16 | 0 | 0 | 16 |
| -26 | 14 | 0 | 0 | 14 |
| -24 | 12 | 0 | 0 | 12 |
| -22 | 10 | 0 | 0 | 10 |
| -20 | 8 | 0 | 0 | 8 |
| -18 | 6 | 0 | 0 | 6 |
| -16 | 4 | 0 | 0 | 4 |
| -14 | 2 | 0 | 0 | 2 |
| -12 | 0 | 0 | 0 | 0 |
| -10 | 0 | 0 | 0 | 0 |
| -8 | 0 | 0 | 0 | 0 |
| -6 | 0 | 0 | 0 | 0 |
| -4 | 0 | 0 | 0 | 0 |
| -2 | 0 | 0 | 0 | 0 |
| 0 | 0 | 0 | 0 | 0 |

| GTN | | | | |
|---|---|---|---|---|
| PIN (dBm) | G1 (dB) | G2 (dB) | G3 (dB) | GT (dB) |
| < -80 | 20 | 20 | 20 | 60 |
| -80 | 20 | 20 | 20 | 60 |
| -78 | 20 | 20 | 20 | 60 |
| -76 | 20 | 20 | 16 | 56 |
| -74 | 20 | 20 | 12 | 52 |
| -72 | 20 | 20 | 8 | 48 |
| -70 | 20 | 20 | 6 | 46 |
| -68 | 20 | 18 | 6 | 44 |
| -66 | 20 | 16 | 6 | 42 |
| -64 | 20 | 14 | 6 | 40 |
| -62 | 20 | 14 | 4 | 38 |
| -60 | 20 | 14 | 2 | 36 |
| -58 | 20 | 14 | 0 | 34 |
| -56 | 18 | 14 | 0 | 32 |
| -54 | 16 | 14 | 0 | 30 |
| -52 | 14 | 14 | 0 | 28 |
| -50 | 12 | 14 | 0 | 26 |
| -48 | 10 | 14 | 0 | 24 |
| -46 | 8 | 14 | 0 | 22 |
| -44 | 6 | 14 | 0 | 20 |
| -42 | 4 | 14 | 0 | 18 |
| -40 | 2 | 14 | 0 | 16 |
| -38 | 0 | 14 | 0 | 14 |
| -36 | 0 | 12 | 0 | 12 |
| -34 | 0 | 10 | 0 | 10 |
| -32 | 0 | 8 | 0 | 8 |
| -30 | 0 | 6 | 0 | 6 |
| -28 | 0 | 4 | 0 | 4 |
| -26 | 0 | 2 | 0 | 2 |
| -24 | 0 | 0 | 0 | 0 |
| -22 | 0 | 0 | 0 | 0 |
| -20 | 0 | 0 | 0 | 0 |
| -18 | 0 | 0 | 0 | 0 |
| -16 | 0 | 0 | 0 | 0 |
| -14 | 0 | 0 | 0 | 0 |
| -12 | 0 | 0 | 0 | 0 |
| -10 | 0 | 0 | 0 | 0 |
| -8 | 0 | 0 | 0 | 0 |
| -6 | 0 | 0 | 0 | 0 |
| -4 | 0 | 0 | 0 | 0 |
| -2 | 0 | 0 | 0 | 0 |
| 0 | 0 | 0 | 0 | 0 |

*FIG. 5*

AUTOMATIC GAIN CONTROL SYSTEM AND METHOD WITH IMPROVED BLOCKER PERFORMANCE

BACKGROUND OF THE INVENTION

Field of the Invention

The present invention relates in general to communication systems, and more particularly to an automatic gain control system for a receiver chain of a receiver with improved blocker performance.

Description of the Related Art

A receiver may include an automatic gain control (AGC) circuit to adjust the gain of one or more gain stages of a receiver chain of the receiver. The AGC circuit is part of an AGC loop that automatically adjusts the gain to modify the amplitude (or power) of the received analog signal so that it is within a suitable range to ensure that the signal-to-noise ratio (SNR) of the signal is sufficiently high, and so that a magnitude of the received signal is within an input range of an analog to digital converter (ADC) for reliable conversion. Peak or root-mean-square (RMS) detectors are useful for communication protocols in which the signal amplitude is constant during the initial observation time, or when the observation time is sufficiently long to allow accurate measurement of the signal power level. However, peak or RMS detectors are not as useful, or not sufficient, for communication protocols that use a non-constant amplitude modulation or when fast AGC settling is required.

Many packet-based communication systems use non-constant amplitude modulation, such as amplitude modulation (AM), single-carrier quadrature amplitude modulation (QAM), multicarrier modulation like orthogonal frequency division multiplexing (OFDM), etc. Many such packet-based communication systems, including some wireless (e.g., Wi-Fi) communications and the like, require fast AGC settling so that the signal strength can be measured digitally, such as using a digital power detector that measures signal power level and provides a received signal strength indicator (RSSI) or the like. RSSI measurement occurs after digital conversion and digital filtering, so that coarse gain adjustment must initially be performed by the AGC circuit to ensure that the received signal amplitude is within the amplitude range of the ADC while also making sure that none of the blocks in the receive signal chain is saturated, clipped, or unduly compressed. Once the desired signal power is reliably measured by RSSI during the preamble portion (front end) of the packet, the gain of the receiver chain may be more finely adjusted and set using a gain back-off table or the like. For example, the AGC may set initial gain to a maximum level, and in the event of saturation of the receiver chain, such as saturation of the ADC, the AGC circuit reduces gain by coarse adjustment until the receiver chain is no longer saturated. Once saturation is removed, the signal power may be measured by RSSI, and once measured, the gain is more finely adjusted based on the received signal power. Fine gain adjustment may be facilitated by a lookup table with predetermined gain levels for each measured signal power level.

A signal "blocker" is a coincident signal at or near the frequency of the signal of interest being received causing various potential impairments to the desired signal, such as distortion, compression, de-sensitization, etc. There may be one or more blockers appearing and going away during each packet reception with variable blocker power, duration, and frequency offset that can change from packet to packet. Also, distortion components can spread outside blocker bands and therefore corrupt desired signals. The digital filtering before RSSI tends to attenuate the blockers and distortion for a relatively accurate signal power measurement by RSSI when the receiver chain is not saturated. The presence of blockers, however, is not necessarily determined so that the gain determination is the same regardless of whether a blocker is distorting the signal. For example, a low level signal may not saturate the receiver chain at maximum gain if there are no blockers. The same low level signal, however, can saturate the back-end of the receiver chain in the presence of a strong blocker. Similarly, a mid-level signal with a blocker may saturate the front-end gain blocks.

The gain settings provided within a conventional gain table were selected to optimize both the SNR and a signal to noise plus distortion ratio (SNDR) of the received signal, but only in the presence of no blocker signals or relatively weak blocker signals. A strong blocker signal, however, may include distortion components that were amplified along with the signal distorting the desired signal. The receiver chain thus could not tolerate higher blocker powers as a function of the desired signal power and blocker offset frequency. The linearity specifications of some of the key receiver chain blocks had to be relatively robust resulting in higher power and higher cost design. As an example, the order of one or more analog and/or digital filters had to be increased in conventional configurations which further increased cost, power consumption, and circuit area.

SUMMARY OF THE INVENTION

A communication system receiver with improved blocker performance according to one embodiment includes a receiver chain, multiple gain tables, a digital circuit, and an AGC circuit. The receiver chain converts a received signal to a digital baseband signal, in which the receiver chain includes multiple gain stages and provides an overload indication when the receiver chain is overloaded. Each gain table has multiple entries in which each entry includes a gain setting for each of the gain stages of the receiver chain as a function of input signal power. A first gain table is configured to optimize the SNR and the SNDR under no blocker or weak blocker conditions, and at least one additional gain table is configured to improve the SNDR under stronger blocker conditions. The digital circuit determines a power level of an encapsulated signal within the digital baseband signal and provides a power level indication indicative thereof. The AGC circuit sets the gain stages of the receiver chain. Multiple coarse gain settings are defined, in which the AGC circuit initially sets the receiver chain to a maximum coarse gain setting. The first gain table may be selected when the saturation indication is not provided at the maximum coarse gain setting. When the saturation indication is provided at the maximum coarse gain setting, the AGC circuit backs off the coarse gain setting to a next coarse gain setting until the overload indication is not provided. The AGC circuit can select a gain table based on a number of discrete back offs of the coarse gain setting, selects an entry of the selected gain table based on the power level indication, and applies the gain settings of the selected entry to the gain stages of the receiver chain.

The gain of the receiving chain may initially be set to the maximum coarse gain setting to ensure detection of weak signals. The number of coarse gain settings and the number of gain tables may be different for different configurations.

In one embodiment, the AGC backs off from the maximum coarse gain setting directly to a minimum coarse gain setting, and if the overload indication is not provided at the minimum coarse gain setting, the AGC circuit may select a second gain table that is configured to optimize SNDR under stronger blocker conditions. The coarse gain settings may include at least one intermediate coarse gain setting in which at least one of the gain stages is set to an intermediate gain. If the overload indication is not provided at the intermediate coarse gain setting, the AGC circuit may still select the first gain table; but if the overload indication is provided at the intermediate coarse gain setting, then the AGC circuit may select the second gain table. In an alternative embodiment, the AGC circuit may include three or more gain tables. A first gain table is configured to optimize the SNR and the SNDR for weak blocker conditions, a last gain table is configured to optimize the SNDR under stronger blocker conditions, and each of one or more intermediate gain tables is configured with improved SNDR under intermediate or strong blocker conditions. Each additional gain table successively improves SNDR at the possible expense of reduced SNR to better handle stronger blocker conditions. The number of back offs of the coarse gain settings suggests the existence of a blocker signal and its relative strength, and a gain table is selected with a corresponding SNDR selected for the suggested blocker signal strength.

Although SNR may be reduced in order to increase SNDR, SNR is still sufficiently high to reliably receive the transmitted signal.

An analog to digital converter (ADC) may be used to convert the analog baseband signal to the digital baseband signal, and may also be used to provide the overload condition as a saturation indication when the analog baseband signal is too strong. The digital circuit may include a digital filter that provides a filtered digital baseband signal, and a receive signal strength indicator that provides the power level indication indicative of the power level of the encapsulated signal provided within the filtered digital baseband signal.

In one embodiment, the receiver chain may include a passive gain network, a low noise amplifier, and a programmable gain amplifier. In this configuration, each entry of each gain table includes a first gain setting for setting the gain of the passive gain network, a second gain setting for setting the gain of the low noise amplifier, and a third gain setting for setting the gain of the programmable gain amplifier.

A method of processing a received signal with improved blocker signal performance according to one embodiment includes processing the received signal through a receiver chain with multiple gain stages to convert the received signal to an analog baseband signal, providing multiple gain tables each having multiple entries in which each entry includes a gain setting for a corresponding gain stage of the receiver chain, converting the analog baseband signal to a digital baseband signal, providing an overload indication when the receiver chain is overloaded, detecting a power level of an encapsulated signal within the digital baseband signal and providing a power level indication, selecting a gain table based on a number of coarse gain setting reductions, selecting an entry of a selected gain table based on the power level indication, and applying gain settings retrieved from a selected entry of a selected gain table to set the gain of the gain stages of the receiver chain.

The gain tables may include a first gain table configured to optimize the SNR and the SNDR for no more than weak blocker conditions, and at least one additional gain table configured to improve SNDR for stronger blocker conditions. The coarse gain of the gain stages of the receiver chain may initially be set to a maximum coarse gain setting to ensure detection of weak signals. The coarse gain setting is then reduced a number of times until the overload indication is not provided, and the number of reductions or coarse gain back-offs is used to select a gain table. A first gain table is optimized for SNR and SNDR for no or weak blocker conditions, a last gain table is optimized for SNDR for stronger blocker conditions, and any intermediate gain tables improve SNDR for stronger blocker conditions.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

FIG. 5 is a tabular diagram illustrating the gain settings of the first gain table GT1 and of the last gain table GTN according to one embodiment of the present invention for selecting the gain settings G1, G2, and G3 for the communication system receiver of FIG. 1 based on the measured power level of the received signal.

DETAILED DESCRIPTION

The inventors have recognized the need to improve the performance of a communication system receiver operating with communication protocols that use non-constant amplitude modulation requiring fast automatic gain control (AGC) when receiving signals in the presence of signal blockers. They have therefore developed an automatic gain control (AGC) system with improved blocker performance based on a number of coarse gain back off steps from maximum gain of the receiver chain in which the number of back off steps is used to select one of multiple gain tables. It is noted that the AGC system described herein may also be used with communication protocols that use constant amplitude modulation. The gain of the receiver chain may initially be set to a maximum level, in which the gain is backed off one or more times when the receiver chain is overloaded or saturated in the presence of a strong receive signal. A first gain table optimizes the signal-to-noise ratio (SNR) and a signal to noise plus distortion ratio (SNDR) for weak blocker conditions whereas each additional gain table improves SNDR for an increased level of blocker performance. The last gain table may optimize SNDR for very strong blockers. Depending upon the number of back off steps that are allowed, one or more intermediate gain tables may be included, in which each intermediate table successively improves SNDR at the possible expense of SNR. The received signal is converted to a digital signal and the signal strength is determined using received signal strength indication (RSSI) or the like to provide an input signal strength value PIN. PIN is used to select an entry in the selected gain table, in which each entry includes one or more gain settings used to control the gain of one or more gain stages of the receiver chain.

In summary, the number of coarse gain back off steps along with the measured desired channel power level is used as an indication of the possible presence of a strong blocker signal, in which SNDR is increased at the possible expense of reduced SNR to improve blocker performance. SNR nonetheless remains sufficiently high to reliably detect and capture the received signal.

Figure 1:
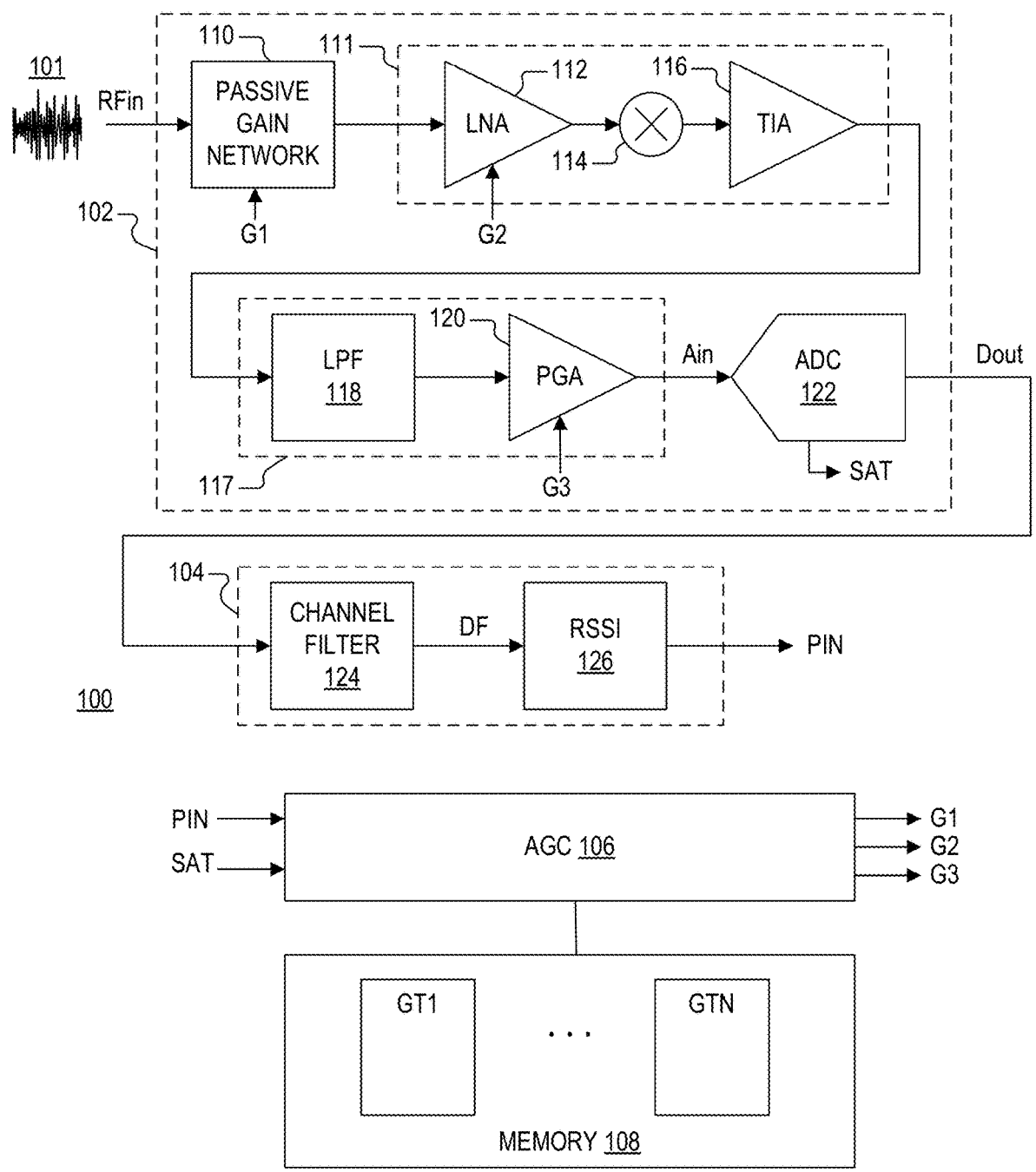
FIG. 1 is a simplified block diagram of a communication system receiver implemented according to one embodiment of the present invention.

FIG. 1 is a simplified block diagram of a communication system receiver 100 implemented according to one embodiment of the present invention. The communication system receiver 100 may be implemented as a wired or wireless receiver depending upon the particular application. The communication system receiver 100 includes a receiver chain 102, a digital circuit 104, an automatic gain control (AGC) circuit 106, and may further include a memory 108 for storing multiple gain tables GT1-GTN. The receiver chain 102 includes a first gain stage including a passive gain network 110, a second gain stage 111 including a low-noise amplifier (LNA) 112, a mixer 114, and a transimpedance amplifier (TIA) 116, a third gain stage 117 including a low-pass filter (LPF) 118 and a programmable gain amplifier (PGA) 120, in which the components of the gain stages are coupled in series for receiving and converting a radio frequency (RF) input signal RFin to an analog baseband signal Ain. The receiver chain 102 includes an analog to digital converter (ADC) 122 that converts Ain to a digital baseband signal Dout provided to the digital circuit 104.

A simplified graphic 101 illustrates a form of RFin having a variable amplitude. The receiver chain 102 is simplified in that only a portion of the overall signal chain is shown, such as only showing one phase of an in-phase portion or a quadrature phase portion typically included in RF receiver configurations. The mixer 114, for example, may receive an in-phase oscillation signal (not shown) for stepping the frequency of RFin to an intermediate frequency or even down to a baseband frequency.

The gain of each of the gain stages may be adjusted by the AGC circuit 106. As an example, the passive gain network 110, the LNA 112, the TIA 116, and the PGA 120 may each have separate controllable gain settings. In the illustrated embodiment the receiver chain 102 has three different gain settings, where it is understood that a different number of gain settings may be included in alternative embodiments, such as only two gain settings or more than three gain settings. In the illustrated embodiment, the AGC circuit 106 provides a first gain setting G1 to adjust the gain of the passive gain network 110 of the first gain stage, the AGC circuit 106 provides a second gain setting G2 to adjust the gain of the LNA 112 of the second gain stage 111, and the AGC circuit 106 provides a third gain setting G3 to adjust the gain of the PGA 120 of the third gain stage 117. It is noted that the TIA 118 may have a fixed gain or the collective gain of the LNA 112, the mixer 114 and TIA 116 may be defined by G2. In another embodiment, the AGC circuit 106 may provide a fourth gain setting to separately adjust the gain of the TIA 118. Assuming gains are expressed in decibels (dB), the total gain of the receiver chain 102 is G1+G2+G3 for converting RFin to Ain provided to an input of the ADC 122.

Dout is provided to an input of a digital channel filter 124, which filters Dout (such that any potential residual blocking power remaining from the analog front end chain is sufficiently attenuated below noise level) and provides a filtered digital baseband signal DF to a received signal strength indication (RSSI) circuit 126. The RSSI circuit 126 measures the signal strength of the received signal contained within the DF signal and asserts an input power signal PIN to an input of the AGC circuit 106. In the illustrated configuration, the ADC 122 detects an overload condition as a saturation condition and outputs a corresponding saturation signal SAT to another input of the AGC circuit 106. In an alternative embodiment, the ADC 122 may indicate the overload condition to the channel filter 124, which responds by asserting SAT to the AGC circuit 106. In yet another embodiment, one or more of the gain devices in the receiver chain 102 may indicate an overload condition to the AGC circuit 106. A data packet or the like is encapsulated within RFin and also within Ain, Dout and DF when there is no overload in the receiver chain 102. PIN indicates the relative power level of the received signal (or data packet) contained within the DF signal. The AGC circuit 106 uses SAT and PIN along with a selected one of multiple gain tables GT1, GTN to adjust the gain settings G1-G3 so that the SNR of the signal at the demodulator input is within a predetermined target range.

The gain tables are ultimately used to set the final values of the gain settings G1-G3. Prior to selecting a gain table and corresponding gain settings, however, the AGC circuit 106 defines and employs multiple "coarse" gain settings to the gain stages of the receiver chain 102. The coarse gain settings at least include a maximum coarse gain setting and a minimum coarse gain setting, and may include one or more intermediate coarse gain settings. For example, if each of the gain stages and corresponding gain settings ranges from 0 decibels (dB) to 20 dB, then G1-G3 are each set to 20 dB for the maximum coarse gain setting and 0 dB for the minimum coarse gain setting. For each intermediate coarse gain setting, the gain setting for one or more of the gain stages is set to an intermediate gain level. In one embodiment, the specific allocations of G1-G3 may be predetermined or otherwise prestored. The relative gains between G1-G3 in each of the entries in the gain tables GT1-GT3, however, provide more complicated gain distribution to determine relative values of SNR and SNDR as further described herein.

In general, the AGC circuit 106 initially sets G1-G3 to a maximum coarse gain setting for receiving a signal, in which a maximum coarse gain setting ensures that a weak signal (e.g., a signal close the receiver sensitivity level) may be detected. If SAT is asserted indicating that the gain is too high, the AGC circuit 106 reduces or "backs off" the gain to a next lower one of one or more additional coarse gain settings between the maximum coarse gain setting down to the minimum coarse gain setting until SAT is no longer asserted. In other words, the AGC circuit 106 adjust the coarse gain setting simply by transitioning from one coarse gain setting to the next. Once SAT is no longer asserted at a particular coarse gain setting, the AGC circuit 106 accesses the memory 108 and selects one of the gain tables GT1-GTN based on a number of coarse gain back off steps as further described herein. Then the AGC circuit selects an entry of a selected one of the gain tables GT1-GTN using the signal power level PIN as an index into the selected gain table.

Each entry of each of the gain tables GT1-GTN includes a value for each of the gain settings G1-G3. The gain table that is selected depends upon the particular configuration and the number of coarse gain back-offs that occur as further described herein. The first gain table GT1 may include gain setting values that are optimized for SNR and SNDR for no blocker conditions or nor more than weak blocker conditions. The last gain table GTN may include gain setting values in which SNDR is optimized for the strong blocker conditions. Any intermediate gain tables, such as a second gain table GT2, for example, may include gain setting values in which SNDR is successively improved for handling stronger blocker conditions. It is noted that SNDR may be improved at the possible expense of SNR in which SNR may be somewhat reduced. Thus, for example, each intermediate gain table, if any, includes gain setting values designed to improve SNDR at the possible expense of SNR for progressively increasing blocker power levels. Nonetheless, SNR remains sufficiently high in each of the gain tables GT1-GTN to acquire the signal with integrity, but SNR may be somewhat reduced in the additional gain tables to increase SNDR to improve performance when the received signal is in the presence of a strong signal blocker.

Any number of gain tables GT1-GTN may be defined in which N is an integer equal to 2 or more. In one embodiment, N is 2 in which there are only two gain tables, GT1 and GT2, in which GT1 is the first gain table optimized for SNR and SNDR for signals without significant blocker interference, and GT2 is the last gain table that is optimized for SNDR for signals in the presence of strong blockers. If one or more intermediate gain tables are included, the gain setting values of each additional intermediate gain table are selected to improve SNDR. The gain tables GT1-GTN are shown stored in the memory 108 accessed by the AGC circuit 106, although alternative configurations are contemplated. For example, the gain tables may be incorporated within the AGC circuit 106.

The memory 108 may include any combination of volatile and non-volatile memory for storing data and information, including, for example, various programmable settings, values or parameters. The volatile memory portion of the memory 108 may include, for example, a random access memory (RAM) or the like including registers and the like that may be programmed on the fly during operation for storing run-time data or the like. Information stored in the volatile memory portion (e.g., RAM) is generally lost when power is removed. The non-volatile memory portion of the memory 108 may include, for example, a read-only memory (ROM) or the like that stores permanent information that does not change during operation or when power is removed. The non-volatile memory portion of the memory 108 may also include FLASH memory or the like that stores non-volatile data and information that may be reprogrammed during operation and is not lost when power is removed. The gain tables GT1-GTN may be stored in a non-volatile portion of the memory 108.

For packet-based communication, a transmitter (not shown) encapsulates a data packet within a communication frame and transmits the frame which is received as RFin by the receiver chain 102 of the communication system receiver 100. The receiver chain 102 converts the RFin signal to the digital baseband signal Dout, which is converted by the digital channel filter 124 to DF provided to the RSSI circuit 126 which measures the power level of the received signal. The AGC process is performed at the beginning of each packet reception during a portion of the preamble of the data packet, in which the preamble contains a known repetitive pattern within a short period. The RMS power level of the preamble may be determined reliably within a short period of time. The preamble SNR compared to the actual data payload SNR does not have to be large to compute adequate signal power information.

There may be one or more signal blockers that appear and disappear during packet reception, in which each signal blocker has a corresponding power level, duration, and frequency offset that may change from packet to packet. As further described herein, the number of coarse gain back-off adjustments during signal reception is used by the AGC circuit 106 to determine which if the gain tables GT1-GTN is used to adjust the gain settings G1-G3 of the receiver chain 102 to optimize signal reception.

Figure 2:
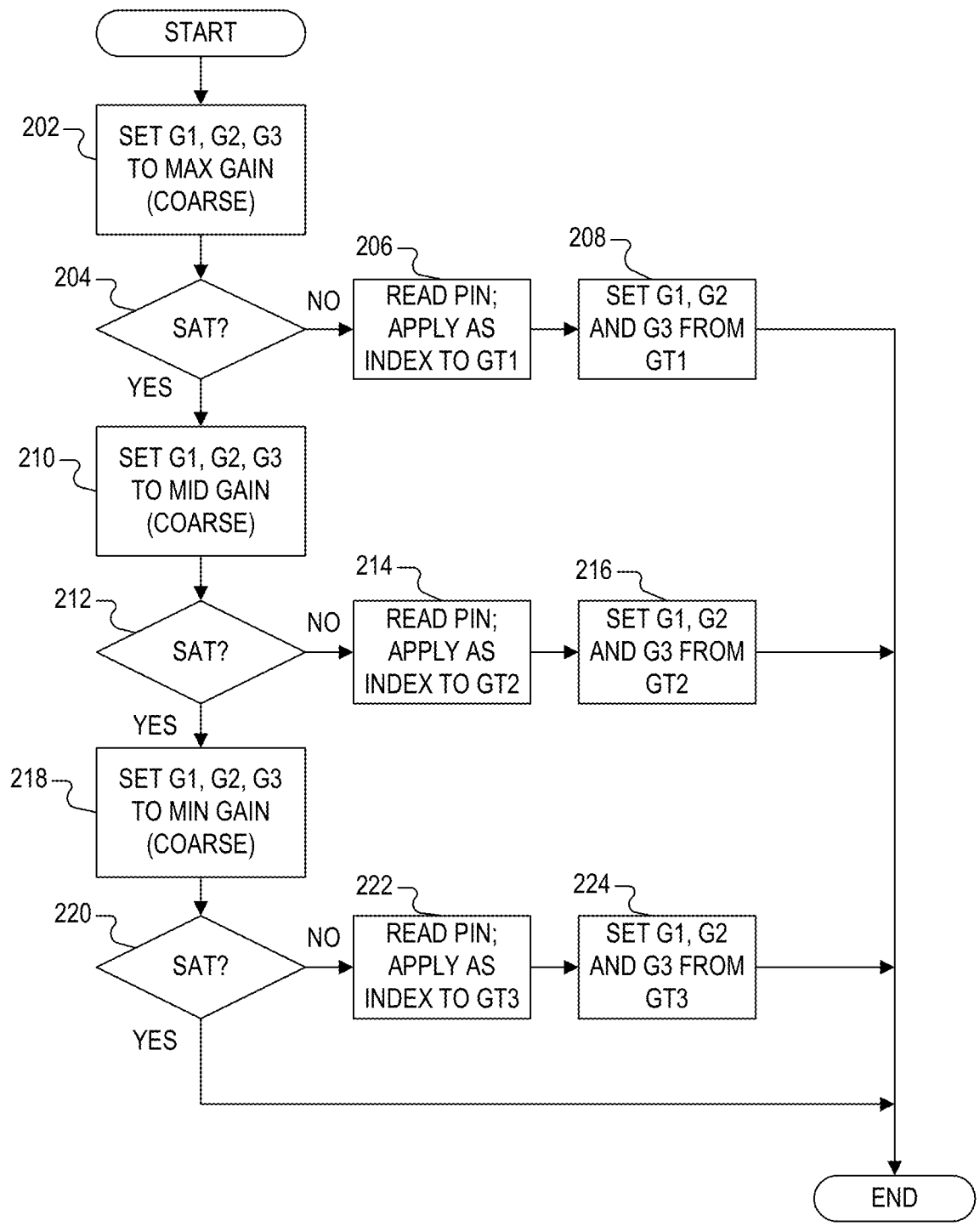
FIG. 2 is a flowchart diagram illustrating operation of the AGC circuit of FIG. 1 according to one embodiment of the present invention.

FIG. 2 is a flowchart diagram illustrating operation of the AGC circuit 106 according to one embodiment of the present invention. In this case, N=3 so that there are 3 gain tables, GT1, GT2 and GT3. GT1 is configured to optimize performance (SNR and SNDR) assuming there are no blockers or blocker power is relatively low, GT3 is configured to optimize SNDR for very strong blockers, and GT2 is configured with improved SNDR for moderately strong blockers. At first block 202, the gain settings G1, G2 and G3 are set to a maximum coarse gain setting. In one embodiment, the maximum coarse gain setting is determined such that each gain setting G1-G3 is set to its maximum value. At next block 204, when a signal is detected being received and SAT is not asserted when the coarse gain setting is at maximum, then operation proceeds to block 206 in which PIN is read and applied as an index to the first gain table GT1. In other words, the gain table GT1 is selected when there are no reductions or back-offs from the maximum coarse gain setting. At next block 208, the corresponding gain settings retrieved from the gain table GT1 at an entry (e.g., table row) pointed to by PIN are retrieved to set the values of G1, G2 and G3 and operation is completed.

In this first case, the power level of the received signal may be relatively weak and any blockers that may be present are also weak and relatively inconsequential. In this case, performance is optimized to capture the desired signal.

Referring back to block 204, if SAT is asserted indicating that the receiver chain 102 is saturated (e.g., overloaded), then operation instead advances to block 210 in which the coarse gain setting is set to a middle (MID) gain level. This also is a coarse gain setting in which the sum of the gain settings G1+G2+G3 is a medium level gain between MAX and MIN, in which the gain setting of one or more of the gain stages is set to an intermediate level. SAT is queried at next block 212, and if SAT is not asserted when the coarse gain setting is at the middle level, then operation proceeds to block 214 in which PIN is read and applied as an index to the second gain table GT2. In other words, the gain table GT2 is selected when there is just one coarse gain reduction or one back off step from the maximum coarse gain setting to a middle or intermediate coarse gain setting. At next block 216, the corresponding gain settings retrieved from the gain table GT2 at an entry or row pointed to by PIN are retrieved to set the values of G1, G2 and G3 and operation is completed.

In this case, the desired signal may have a medium level strength with or without a blocker present. SNR is sufficiently high in the gain table GT2 to reliably receive the desired signal. Also, the gain table GT2 is configured to increase SNDR to reduce the impact of any blocker that may be present. In this manner, the gain table GT2 improves SNDR to improve blocker performance.

Referring back to block 212, if SAT is still asserted indicating that the receiver chain 102 is overloaded, then operation instead advances to block 218 in which the gains are set to the minimum (MIN) coarse gain level. This is also a coarse setting in which each gain setting G1-G3 is set to its minimum value. At next block 220, if SAT is not asserted when the coarse gain setting is at the minimum level, then operation proceeds to block 222 in which PIN is read and applied as an index to the third gain table GT3. In other words, the gain table GT3 is selected when there are two coarse gain reductions or two back off steps from the maximum coarse gain setting to the minimum coarse gain setting. In one embodiment, GT3 is configured to optimize SNDR for strong blocker conditions. At next block 224, the corresponding gain settings retrieved from the gain table GT3 at an entry or row pointed to by PIN are retrieved to set the values of G1, G2 and G3 and operation is completed. Referring back to block 220, if SAT is still asserted, then the signal is too strong to receive and other measures (not described) may be performed.

In this case, the desired signal may be relatively strong with or without a strong blocker present. If the desired signal is relatively strong, then SNR is sufficiently high in the gain table GT3 to reliably receive the signal. If the blocker is strong, then SNDR is optimized in the gain table GT3 to minimize the impact of the strong blocker.

Figure 3:
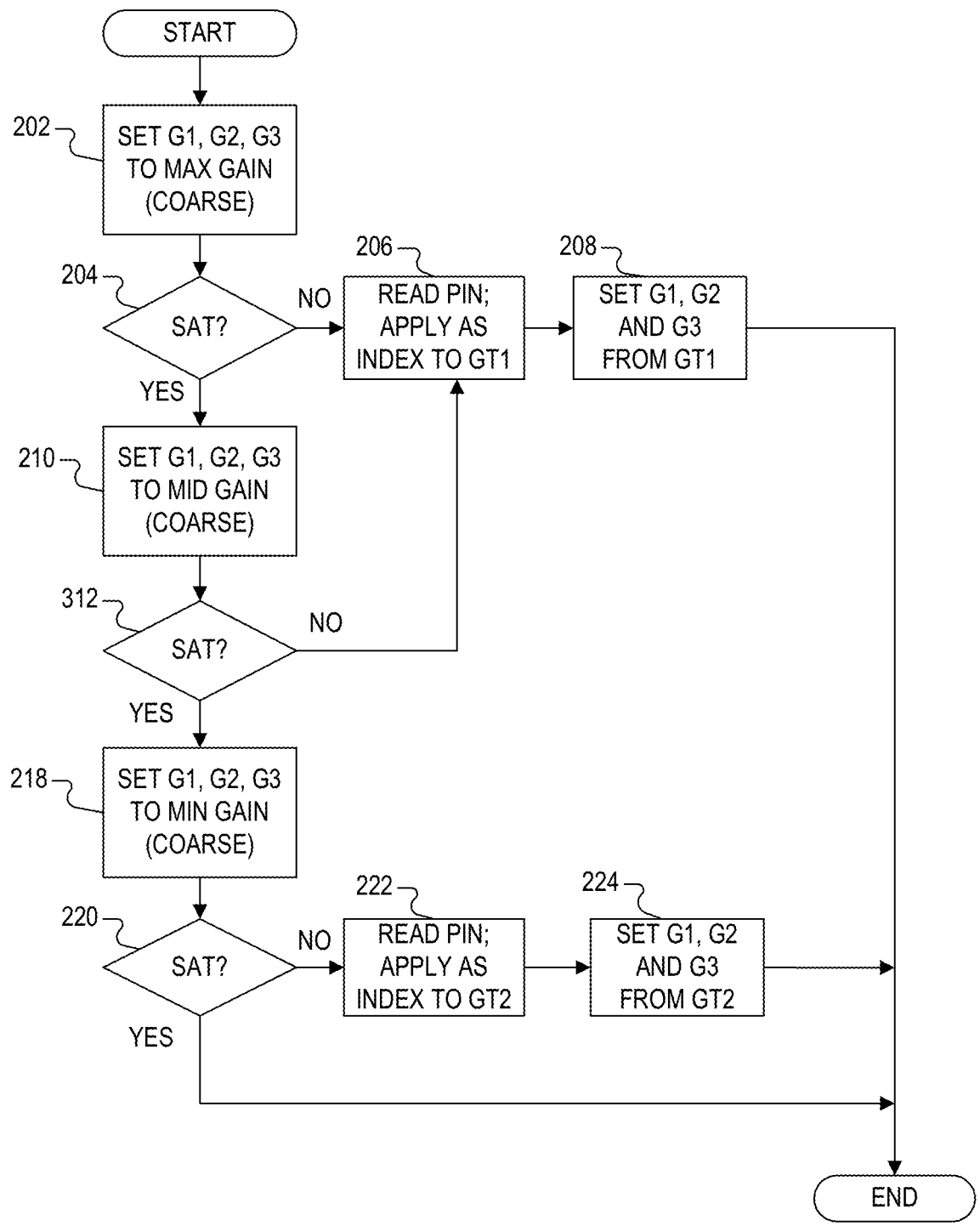
FIG. 3 is a flowchart diagram illustrating operation of the AGC circuit of FIG. 1 according to another embodiment of the present invention.

FIG. 3 is a flowchart diagram illustrating operation of the AGC circuit 106 according to another embodiment of the present invention. In this case, N=2 so that there are only 2 gain tables, GT1 and GT2. GT1 is configured to optimize SNR and SNDR assuming there are no blockers or blocker power is relatively weak, whereas GT2 is configured to improve or even optimize SNDR for strong blockers. Operation is substantially similar to that of the flowchart of FIG. 2, except that block 212 is replaced by block 312 and blocks 214 and 216 are eliminated. Similar blocks as those in FIG. 2 are included with the same reference numbers. In this case, when saturation is not detected at block 312 after setting the coarse gain setting to the mid level, operation advances to block 206 and then to block 208 in which the first gain table GT1 is used rather than an intermediate gain table. In this case, if the desired signal has a medium level strength with or without a blocker present, then the first gain table GT1 is still used.

Operation is similar when SAT is asserted at block 312 in which operation advances to block 218. In this case, when SAT is not asserted at block 220, then operation advances to blocks 222 and 224 in which PIN is used as the index to access the gain settings from table GT2. Here, the second gain table GT2 is configured to optimize SNDR for strong blockers. Also, if SAT is still asserted at block 220, then the signal is too strong to receive and other measures (not described) may be performed.

Figure 4:
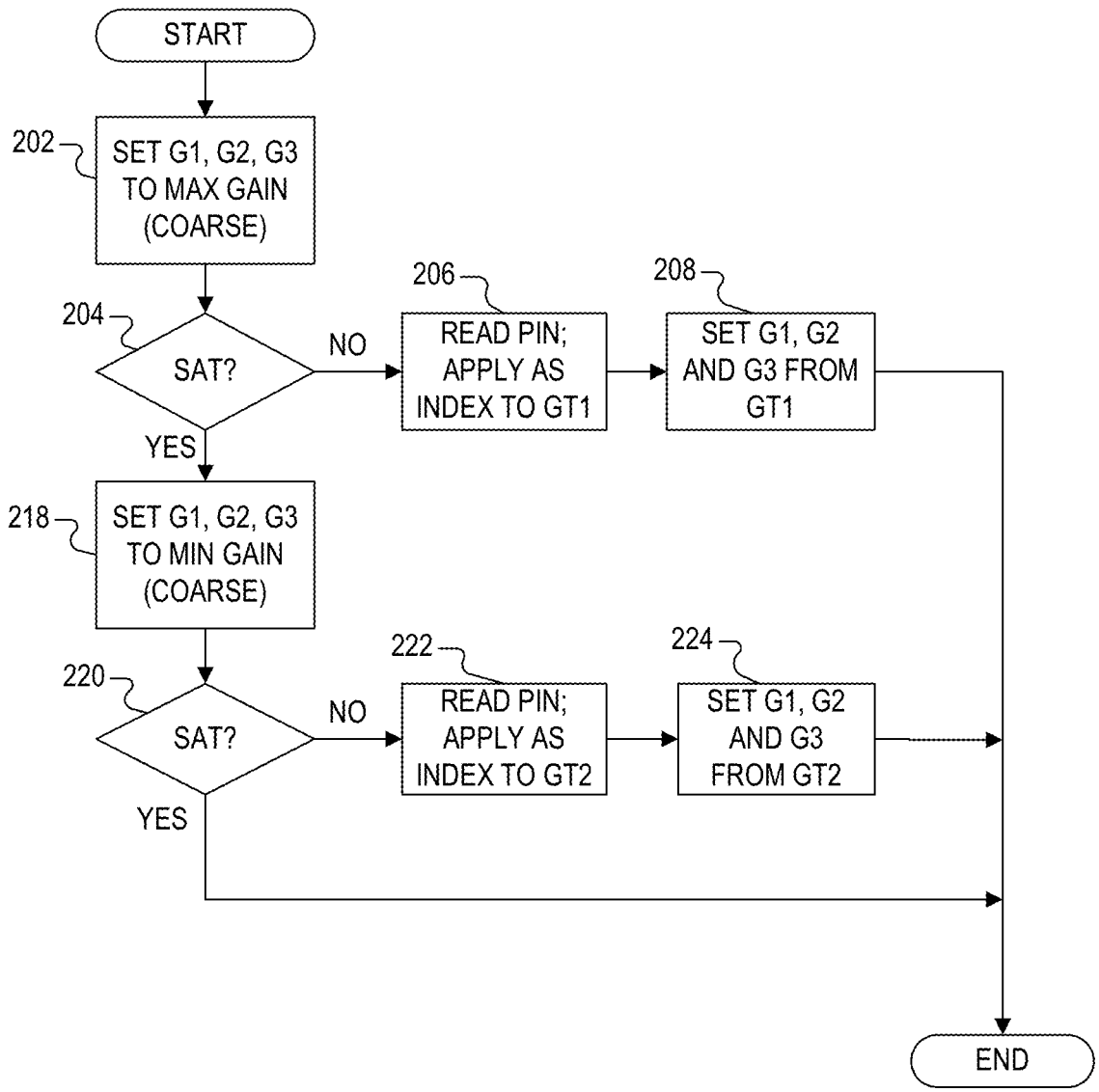
FIG. 4 is a flowchart diagram illustrating operation of the AGC circuit of FIG. 1 according to yet another embodiment of the present invention.

FIG. 4 is a flowchart diagram illustrating operation of the AGC circuit 106 according to yet another embodiment of the present invention. The flowchart of FIG. 4 is similar to that of FIG. 3 in which N=2 so that there are only 2 gain tables, GT1 and GT2. Again, GT1 is configured to optimize SNR and SNDR assuming there are no blockers or blocker power is relatively weak, and GT2 is configured to optimize SNDR for strong blocker conditions. Operation is substantially similar to that of the flowchart of FIG. 3, except that blocks 210 and 312 are eliminated. Similar blocks as those in FIG. 3 are included with the same reference numbers. In this case, if SAT is asserted at block 204, operation advances directly to block 218 in which the coarse gain setting is changed directly to the minimum gain level (or close to the minimum gain level). Again, if SAT is not asserted when the coarse gain is at the minimum level at block 220, then operation proceeds to block 222 in which PIN is read and applied as an index to the second gain table GT2. At next block 224, the corresponding gain settings retrieved from the gain table GT2 at an entry or row pointed to by PIN are retrieved to set the values of G1, G2 and G3 and operation is completed. If SAT is still asserted at block 220, then the signal is too strong to receive and other measures (not described) may be performed.

The embodiment of FIG. 4 has one advantage of being relatively simple and easy to configure since there are only two coarse gain settings and two gain tables. If the maximum coarse gain setting does not cause saturation, then table GT1 is used to set the final gain settings G1-G3. If, however, the maximum coarse gain setting does cause overload or saturation, then if not overload or saturated at the minimum coarse gain setting, table GT2 is used to set the final gain settings G1-G3. In this case, GT1 is configured to optimize performance assuming there are no blockers or blocker power is relatively low, and GT2 is configured to optimize SNDR for better performance in the presence of strong blockers.

FIG. 5 is a tabular diagram illustrating the gain settings of the first gain table GT1 and of the last gain table GTN according to one embodiment of the present invention for selecting the gain settings G1, G2, and G3 for the communication system receiver 100 based on the value of PIN. The specific gain setting values and distribution of gain setting values in each of the tables GT1 and GTN are specific to a particular implementation and may be different for another implementation. Nonetheless, the relative gain setting values between the two tables GT1 and GTN for the different values of PIN illustrate how the gain settings may be adjusted to achieve appropriate levels of SNR and SNDR.

In the illustrated configuration, each of the gain settings ranges from a minimum gain of 0 decibels (dB) to a maximum gain of 20 dB, so that the total gain GT=G1+G2+G3, also listed in the tables, ranges from a minimum total gain of 0 dB to a maximum total gain of 60 dB. The input power index PIN for both tables ranges from a minimum gain of less than −80 dB relative to 1 milliwatt (dBm), or <−80 dBm, at the top row of each gain table, to a maximum PIN gain of 0 dBm at the bottom row of each gain table. The second row from the top for each gain table shows the gain settings for PIN=−80 dBm, in which PIN increases from one row to the next by 2 dBm from the second row from the top up to 0 dBm in the last row at the bottom.

As shown for the gain table GT1, the gain settings G1-G3 remain at their maximum values, or 20 dB each, for PIN ranging up to about −72 dBm. As shown at 502, as PIN is incrementally increased from −70 dBm to −52 dBm, G3 is incrementally decreased from 18 dB down to 0 dB, whereas G1 and G2 remain at their maximum values. As shown at 504, as PIN is incrementally increased from −50 dBm to −32 dBm, G3 remains at 0 dB, G1 remains at 20 dB, and G2 is incrementally decreased from 18 dB down to 0 dB. As shown at 506, as PIN is incrementally increased from −30 dBm to −12 dBm, G2 and G3 both remain at 0 dB, and G1 is incrementally decreased from 18 dB down to 0 dB. G1, G2 and G3 are at 0 dB for PIN ranging from −12 dBm up to 0 dBm. In summary for the gain table GT1 for optimizing performance for weak blocker conditions, the total gain GT remains at 60 dB for low power levels of PIN until PIN reaches −70 dBm, then G3 is incrementally decreased until PIN reaches −52 dBm (while G1 and G2 remain at maximum gain of 20 dB), then G2 is next incrementally decreased until PIN reaches −32 dBm (while G1 remains at maximum gain of 20 dB and G3 remains at minimum gain of 0 dB), and then G1 is incrementally decreased until PIN reaches −12 dBm when all 3 gain settings G1-G3 are at 0 dB. It is noted that in this table the gains are backed-off starting from the last one in the analog receive chain. Once the gain range of one block is fully exhausted, gain back-off is continued from the one preceding gain block until all the gain blocks are set to minimum gain. In many cases, in a well optimized receive chain this results in lowest noise-figure for a given setting resulting in the best SNR limited blocking performance. More generally, such a gain back off scheme of table GT1 attempts to trade-off other constraints as well, such as gain-step and RSSI accuracy, noises at extreme gains, adequate headroom for potential appearance of mid-level blockers during packets.

The gain settings in the gain table GTN follow a different pattern for improving or otherwise optimizing SNDR at a potentially decreased level of SNR for different values of PIN for the particular configuration. As shown for the gain table GTN, the gain settings G1-G3 remain at their maximum values, or 20 dB each, for PIN at −80 dBm or less. As shown at 512, as PIN is incrementally increased from −78 dBm to −70 dBm, G3 is first incrementally decreased from 20 dB down to 6 dB while G1 and G2 remain at their maximum values. Then as shown at 514, as PIN is incrementally increased from −68 dBm to −64 dBm, G3 remains at 6 dB and G1 remains at 20 dB while G2 is incrementally decreased from 18 dB down to 14 dB. Then as shown at 516, as PIN is incrementally increased from −62 dBm to −58 dBm, G2 remains at 14 dB and G1 remains at 20 dB while G3 is incrementally decreased from 4 dB down to 0 dB. Then as shown at 518, as PIN is incrementally increased from −56 dBm to −38 dBm, G3 remains at 0 dB and G2 remains at 14 dB while G1 is incrementally decreased from 18 dB down to 0 dB. Then as shown at 520, as PIN is incrementally increased from −36 dBm to −24 dBm, G1 and G3 both remain at 0 dB while G2 is incrementally decreased from 12 dB down to 0 dB. Finally as PIN is incrementally increased from −22 dBm to 0 dBm, G1-G3 remain at 0 dB. It is noted that in this gain back-off algorithm earlier blocks in signal chain are started to back-off before fully exhausting the gain range of the following blocks. In this example, the front-end passive network is backed-off before the LNA is fully backed-off. Doing so improves the distortion limited blocking performance of the receiver at the expense of slight degradation of noise-figure for a given gain setting. This would slightly degrade SNR limited performance. However, overall SNDR would improve for higher blocker signals.

It is readily apparent that the gain settings G1-G3 are not equally adjusted in the gain tables GT1-GTN as is typical for the coarse gain settings; instead, the gain settings G1-G3 are adjusted one at a time for particular power level ranges of PIN resulting in unequal gain distributions within the tables. The particular gain setting distributions and adjustments may differ from one configuration to the next, and may be determined empirically, such as during manufacturing testing.

In the particular configuration illustrated, GT1 is optimized for no or weak blocker conditions. In some configurations, such as the configurations described in FIGS. 3 and 4, only two gain tables are used (when GTN=GT2). Although not shown in FIG. 5, one or more intermediate gain tables may be configured to improve SNDR for stronger blocker conditions. For example, for the configuration described in FIG. 2 when N=3 for three gain tables in which GTN=GT3, an intermediate gain table GT2 is further determined and stored in the memory 108.

It is further noted that the gain settings in the gain tables are not used for the coarse gain adjustments in response to saturation indicated by SAT. As previously described, the initial gain settings are G1=G2=G3=20 dB (for configurations in which the maximum gain is 20 dB), and if SAT is asserted indicating overload or saturation, one or more of the gain settings may be reduced for an intermediate gain or even a minimum gain. In the configurations described for FIGS. 2 and 3, for example, the coarse setting for MID GAIN could simply be G1=G2=G3=10 dB, which is not found in either of the gain tables GT1 or GTN shown in FIG. 5. If SAT is not asserted for the MID GAIN setting, then one of the gain tables is consulted to determine each of the gain settings for G1-G3 based on the determined value of PIN.

Figure 6:
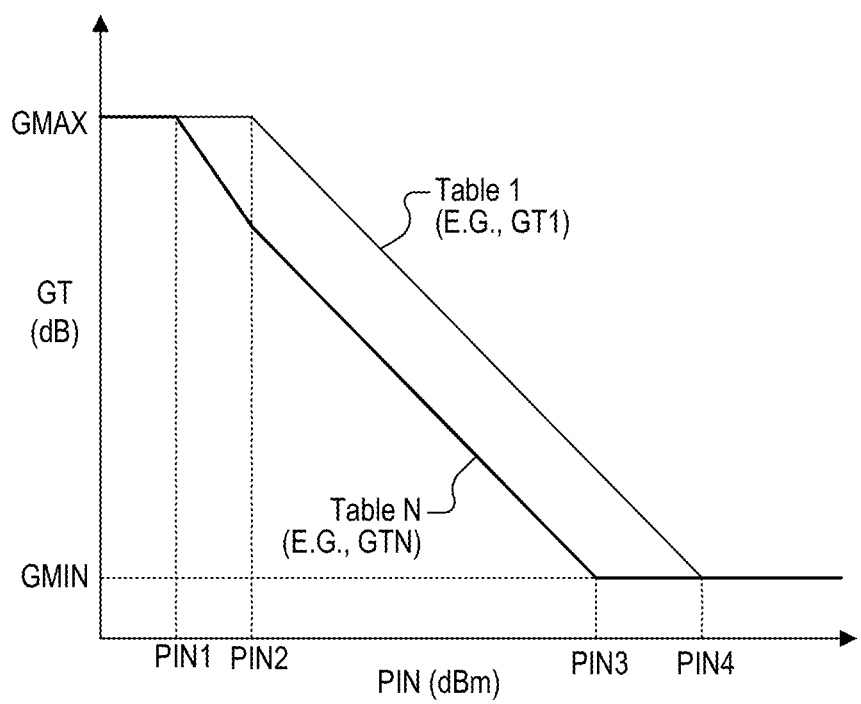
FIG. 6 is a plot of total gain versus input signal power for a first table with optimal SNR versus a last table with optimal SNDR according to one embodiment of the present invention.

FIG. 6 is a plot of total gain GT (dB) versus signal power PIN for a first table (Table 1—regular line, corresponding with gain table GT1) versus a last table (Table N—bold line, corresponding with gain table GTN) according to one embodiment of the present invention. The plot of gain does not necessarily correspond directly with the gain tables GT1 and GTN shown in FIG. 5, yet nonetheless illustrates back off of gain in a similar manner in which Table 1 corresponds with table GT1 optimized for SNR and SNDR, whereas Table N corresponds with table GTN optimized for SNDR. When the received power level PIN is at a minimum level, the total gain GT for the receiver chain 102 is at a maximum level GMAX. The total gain GT begins to back off at a PIN value of PIN1 for Table N, whereas GT backs off later at a PIN value of PIN2 for Table 1, in which PIN2>PIN1. Also, the total gain GT for Table N reaches a minimum value for GT, shown as GMIN, when PIN=PIN3, whereas the total gain GT for Table 1 reaches GMIN when PIN=PIN4, in which PIN4>PIN3. In this manner, the gain of the receiver chain 102 is reduced for Table N as compared to Table 1. It is noted that in practice, the gain can be reduced and or distributed differently from that shown.

Figure 7:
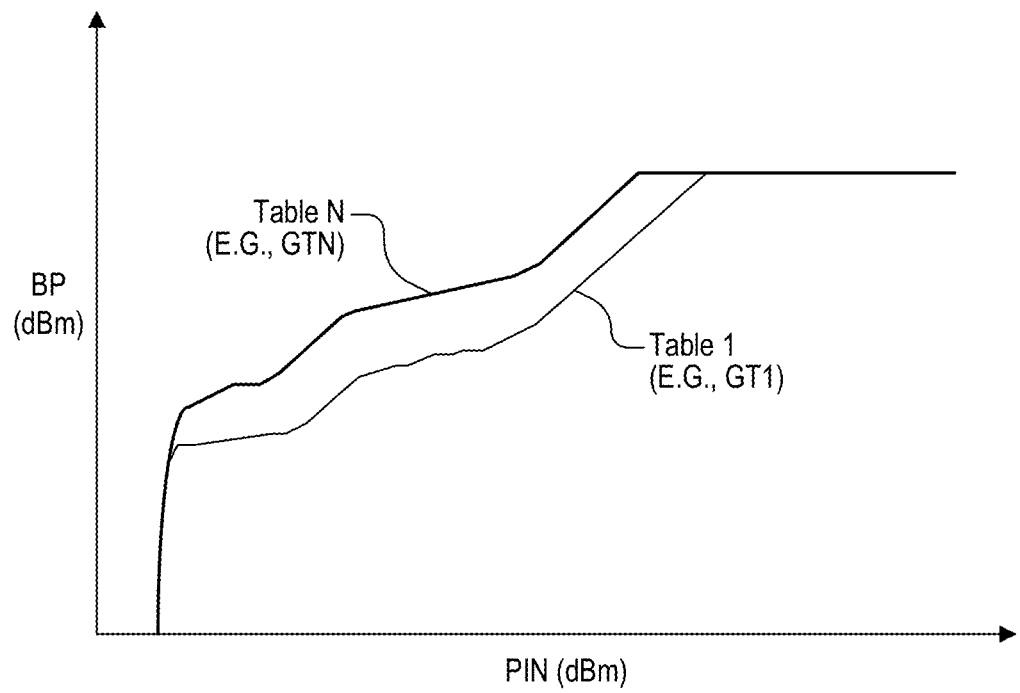
FIG. 7 is diagram plotting the maximum blocker power level of a blocker signal relative to the desired input signal level power across the full range of desired signal power range for a single gain table versus multiple gain tables according to one embodiment of the present invention.

FIG. 7 is diagram plotting the maximum blocker power level BP (dBm) of a blocker signal relative to the desired signal level power PIN (dBm) across the full range of desired signal power range (from sensitivity level signal to maximum level that the receiver can tolerate) for a single gain table, such as exemplified by Table 1 (regular line), and for multiple gain tables, such as exemplified by Table N (bold line) according to one embodiment of the present invention. As shown in FIG. 7, across a wide desired signal power range the maximum blocker level the receiver chain can tolerate is improved (from slightly above sensitivity to the mid signal levels, the most improvement being in mid signal levels) for a multiple table configuration. In this manner, for a given desired signal power PIN, the receiver chain can operate with higher blocker power signals.

Figure 8:
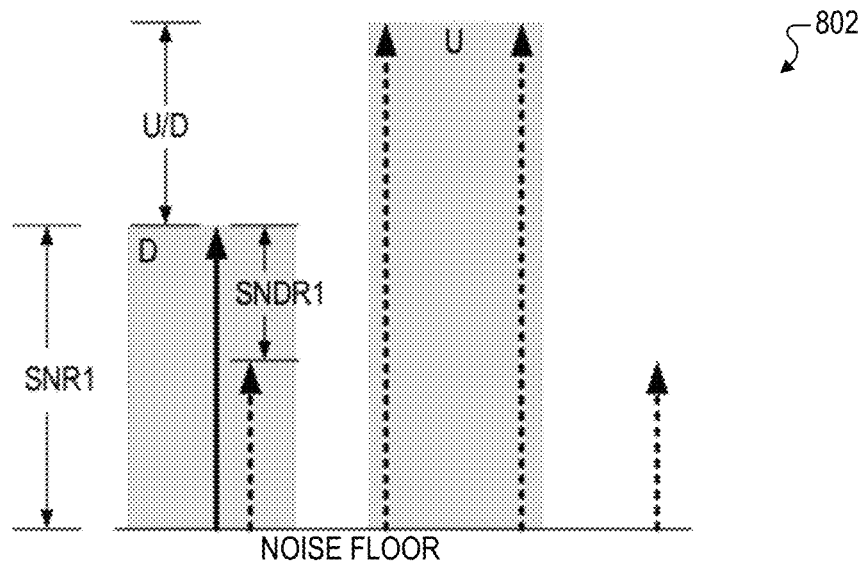
FIG. 8 is a figurative diagram illustrating SNR versus SNDR in the presence of a blocker signal U for a conventional configuration versus a configuration using multiple gain tables according to an embodiment of the present invention.
Figure 8:
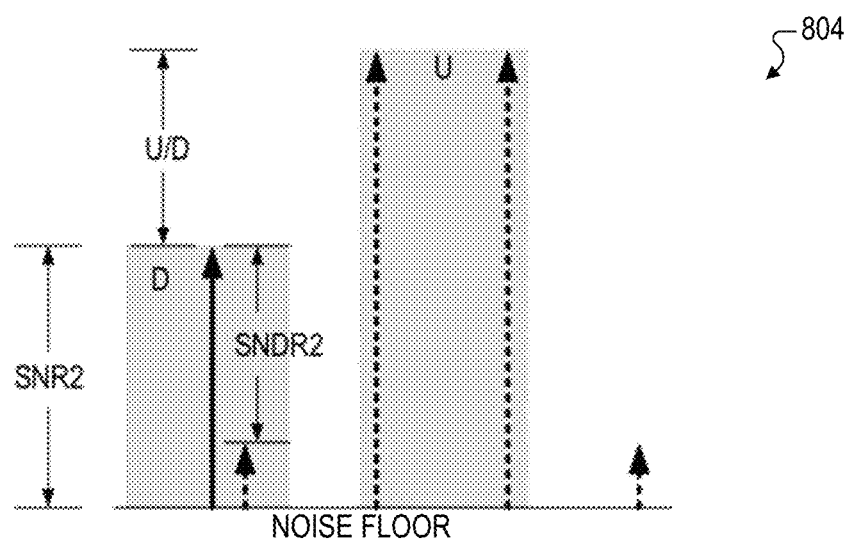

FIG. 8 is a figurative diagram illustrating SNR versus SNDR in the presence of a blocker signal U for a conventional configuration, shown by plot 802, compared to a configuration using multiple gain tables, shown at 804, according to an embodiment of the present invention. For the conventional configuration shown at 802, the SNR level is SNR1 and the SNDR level is SNDR1, and for the configuration using multiple tables shown at 804, the SNR level is SNR2 and the SNDR level is SNDR2 for the same blocker power level. Although SNR2 is slightly less than SNR1, SNDR2 is significantly greater than SNDR1 illustrating that SNDR is significantly improved at the expense of a slight drop of SNR for the configuration 804 using multiple gain tables. Thus, although SNR is slightly degraded when using multiple back off tables, the distortion components reduce at a greater rate. The net result is increased dynamic range (DR) and reduced error vector magnitude (EVM). Increased DR and reduced EVM results in a higher performance level of the communication system receiver 100 in the presence of blocker signals. It is noted that using several tables is not the only way to improve SNDR when saturation or compression is detected. A computation of gains is also possible (or even a simple back-off or shift on one of the tables) to improve the blocking performance.

The present description has been presented to enable one of ordinary skill in the art to make and use the present invention as provided within the context of particular applications and corresponding requirements. The present invention is not intended, however, to be limited to the particular embodiments shown and described herein, but is to be accorded the widest scope consistent with the principles and novel features herein disclosed. Many other versions and variations are possible and contemplated. Those skilled in the art should appreciate that they can readily use the disclosed conception and specific embodiments as a basis for designing or modifying other structures for providing the same purposes of the present invention without departing from the spirit and scope of the invention.

The invention claimed is:

1. A communication system receiver with improved blocker performance, comprising:
    a receiver chain that converts a received signal to a digital baseband signal, wherein said receiver chain comprises a plurality of gain stages and provides an overload indication when said receiver chain is overloaded;
    a plurality of gain tables each having a plurality of entries in which each entry includes a gain setting for each of said plurality of gain stages, wherein said plurality of gain tables includes a first gain table that is configured to optimize a signal to noise ratio (SNR) and a signal to noise plus distortion ratio (SNDR) under no blocker or weak blocker conditions, and at least one additional gain table that is configured to improve said SNDR under stronger blocker conditions;
    a digital circuit that determines a power level of an encapsulated signal within said digital baseband signal and that provides a power level indication indicative thereof;
    an automatic gain control (AGC) circuit that sets a gain of each of said plurality of gain stages of said receiver chain, wherein said AGC circuit defines a plurality of coarse gain settings, wherein said AGC circuit initially sets said receiver chain to a maximum coarse gain setting, and when a saturation indication is provided at said maximum coarse gain setting, said AGC circuit backs off said coarse gain setting of said receiver chain to a next one of said plurality of coarse gain settings until said saturation indication is not provided; and
    wherein said AGC circuit selects one of said plurality of gain tables based on a number of discrete back offs of said coarse gain setting, selects an entry of said selected gain table based on said power level indication, and applies a plurality of gain settings of said selected entry to said plurality of gain stages of said receiver chain.

2. The communication system receiver of claim 1, wherein when said overload indication is not provided when said coarse gain setting is at said maximum coarse gain setting, said AGC circuit selects said first gain table.

3. The communication system receiver of claim 1, wherein said at least one additional table comprises a second gain table, wherein said AGC circuit reduces said coarse gain setting of said receiver chain from said maximum coarse gain setting directly to a minimum coarse gain setting when said overload indication is provided at said maximum coarse gain setting, and wherein when said overload indication is not provided at said minimum coarse gain setting, said AGC circuit selects said second gain table.

4. The communication system receiver of claim 1, wherein said AGC circuit reduces said coarse gain setting of said receiver chain from said maximum coarse gain setting to an intermediate coarse gain setting when said overload indication occurs at said maximum coarse gain setting, and wherein said AGC circuit reduces said coarse gain setting from said intermediate coarse gain setting to a minimum coarse gain setting when said overload indication occurs at said intermediate coarse gain setting.

5. The communication system receiver of claim 4, wherein said maximum coarse gain setting comprises a maximum gain setting for each of said plurality of gain stages, wherein said intermediate coarse gain setting comprises an intermediate gain setting for at least one of said plurality of gain stages, and wherein said minimum coarse gain setting comprises a minimum gain setting for each of said plurality of gain stages.

6. The communication system receiver of claim 4, wherein when said overload indication is not provided at said intermediate coarse gain setting, said AGC circuit selects one of said plurality of entries of said first gain table that corresponds to said power level indication.

7. The communication system receiver of claim 4, wherein said at least one additional table comprises an intermediate gain table, and wherein when said overload indication is not provided when at said intermediate coarse gain setting, said AGC circuit selects one of a plurality of entries of said intermediate gain table that corresponds to said power level indication.

8. The communication system receiver of claim 4, wherein said at least one additional table comprises a last one of said plurality of gain tables, and wherein when said overload indication is not provided at said minimum coarse gain setting, said AGC circuit selects one of a plurality of entries of said last one of said plurality of gain tables that corresponds to said power level indication.

9. The communication receiver of claim 1, wherein said receiver chain comprises an analog to digital converter that provides said overload indication as said saturation indication when saturated by an input analog baseband signal.

10. The communication system receiver of claim 1, wherein said digital circuit comprises a digital filter that provides a filtered digital baseband signal, and a receive signal strength indicator that provides said power level indication indicative of said power level of said encapsulated signal within said filtered digital baseband signal.

11. The communication system receiver of claim 1, wherein said receiver chain comprises a passive gain network, a low noise amplifier, and a programmable gain amplifier, and wherein each of said plurality of entries of each of said plurality of gain tables corresponds to a corresponding one of a plurality of power level indications and includes a first gain setting for said passive gain network, a second gain setting for said low noise amplifier, and a third gain setting for said programmable gain amplifier.

12. A method of processing a received signal with improved blocker signal performance, comprising:
   processing the received signal through a receiver chain comprising a plurality of gain stages to convert the received signal to an analog baseband signal;
   providing a plurality of gain tables each having a plurality of entries in which each entry includes a gain setting for each of the plurality of gain stages of the receiver chain, wherein the plurality of gain tables includes a first gain table configured to optimize a signal to noise ratio (SNR) and a signal to noise plus distortion ratio (SNDR) for no blocker or weak blocker conditions, and at least one additional gain table configured to improve the SNDR for stronger blocker conditions;
   converting the analog baseband signal to a digital baseband signal;
   providing an overload indication when the receiver chain is overloaded;
   detecting a power level of an encapsulated signal within the digital baseband signal and providing a power level indication;
   initially setting a coarse gain of the gain stages of the receiver chain to a maximum one of a plurality of coarse gain settings, and when the overload indication is not provided at the maximum coarse gain setting, selecting the first gain table, and when the overload indication is provided at the maximum coarse gain setting, reducing the coarse gain setting until the overload indication is not provided and selecting one of the plurality of gain tables based on a number of coarse gain setting reductions;
   selecting an entry of a selected gain table based on the power level indication; and
   applying gain settings retrieved from a selected entry of a selected gain table to set the gain of the gain stages of the receiver chain.

13. The method of claim 12, wherein said at least one additional gain table comprises a second gain table, and wherein said reducing the coarse gain setting and selecting one of the plurality of gain tables comprises:
   setting the coarse gain setting to a minimum coarse gain setting, and when the overload indication is not provided at the minimum coarse gain setting, selecting the second gain table.

14. The method of claim 12, wherein said at least one additional gain table comprises a second gain table, and wherein said reducing the coarse gain setting and selecting one of the plurality of gain tables comprises:
   setting the coarse gain setting to an intermediate coarse gain setting, and when the overload indication is not provided at the intermediate coarse gain setting, selecting the first gain table.

15. The method of claim 14, wherein said reducing the coarse gain setting and selecting one of the plurality of gain tables comprises further comprises:
   when the overload indication is provided at the intermediate coarse gain setting, setting the coarse gain to a minimum coarse gain setting, and when the overload indication is not provided at the minimum coarse gain setting, selecting the second gain table.

16. The method of claim 12, wherein said at least one additional gain table comprises a second gain table and a third gain table, wherein said reducing the course coarse gain setting and selecting one of the plurality of gain tables comprises further comprises:
   setting the coarse gain setting to an intermediate coarse gain setting, and when the overload indication is not provided at the intermediate coarse gain setting, selecting the second gain table; and
   when the overload indication is provided at the intermediate coarse gain setting, setting the coarse gain setting to a minimum coarse gain setting, and when the overload indication is not provided at the minimum coarse gain setting, selecting the third gain table.

17. The method of claim 12, further comprising:
   filtering the digital baseband signal with a channel filter to provide a filtered digital baseband signal; and
   wherein said detecting a power level of the encapsulated signal comprises detecting a power level of the encapsulated signal within the filtered digital baseband signal.

18. The method of claim 12, wherein said detecting a power level of the encapsulated signal comprises measuring a power level using a digital power detector and providing a received signal strength indicator.

19. The method of claim 12, wherein said applying gain settings retrieved from the selected entry of the selected table comprises applying a first gain setting to a passive gain network, applying a second gain setting to a low-noise amplifier, and applying a third gain setting to a programmable gain amplifier.

20. The method of claim 12, wherein said converting the analog baseband signal to the digital baseband signal comprises using an analog to digital converter (ADC) and wherein said providing an overload indication comprises detecting a saturation condition by the ADC.

* * * * *